(12) United States Patent
Nishita et al.

(10) Patent No.: US 12,025,915 B2
(45) Date of Patent: Jul. 2, 2024

(54) RESIST UNDERLAYER FILM-FORMING COMPOSITION COMPRISING POLYMER HAVING STRUCTURAL UNIT HAVING UREA LINKAGE

(71) Applicant: NISSAN CHEMICAL CORPORATION, Tokyo (JP)

(72) Inventors: Tokio Nishita, Toyama (JP); Yuichi Goto, Toyama (JP); Rikimaru Sakamoto, Toyama (JP); Gun Son, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 762 days.

(21) Appl. No.: 16/483,686

(22) PCT Filed: Feb. 1, 2018

(86) PCT No.: PCT/JP2018/003449
§ 371 (c)(1),
(2) Date: Aug. 5, 2019

(87) PCT Pub. No.: WO2018/143359
PCT Pub. Date: Aug. 9, 2018

(65) Prior Publication Data
US 2020/0124965 A1    Apr. 23, 2020

(30) Foreign Application Priority Data
Feb. 3, 2017   (JP) .................. 2017-018938

(51) Int. Cl.
| G03F 7/11 | (2006.01) |
| C08F 220/22 | (2006.01) |
| C08F 220/34 | (2006.01) |
| G03F 7/20 | (2006.01) |

(52) U.S. Cl.
CPC .............. *G03F 7/11* (2013.01); *C08F 220/22* (2013.01); *C08F 220/34* (2013.01); *G03F 7/2053* (2013.01); *C08F 220/346* (2020.02)

(58) Field of Classification Search
None
See application file for complete search history.

(56) References Cited

U.S. PATENT DOCUMENTS

| 6,329,117 | B1 | 12/2001 | Padmanaban et al. |
| 6,803,168 | B1 | 10/2004 | Padmanaban et al. |

(Continued)

FOREIGN PATENT DOCUMENTS

| CN | 104974314 A | * 10/2015 |
| JP | H11-109640 A | 4/1999 |

(Continued)

OTHER PUBLICATIONS

Machine translation of JP 2012-108480, published on Jun. 7, 2012 (Year: 2012).*

(Continued)

*Primary Examiner* — Anca Eoff
(74) *Attorney, Agent, or Firm* — Oliff PLC

(57) ABSTRACT

A resist underlayer film-forming composition having a dramatically improved crosslinking ability over conventional compositions, and further, a resist underlayer film-forming composition that crosslinks with a component of a resist material, in order to improve the adhesion of a resist underlayer film to a resist pattern. A resist underlayer film-forming composition for lithography including a copolymer having a structural unit of formula (1) and a structural unit of formula (2):

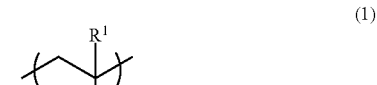

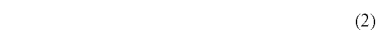

(wherein each $R^1$ is independently a hydrogen atom or a methyl group; each $R^2$ is independently a $C_{1-3}$ alkylene group; $R^3$ is a single bond or a methylene group; A is a linear, branched, or cyclic aliphatic group having a carbon atom number of 1 to 12 and optionally having a substituent, or a $C_{6-16}$ aromatic or heterocyclic group optionally having a substituent; and Pr is a protecting group); a crosslinking agent; an organic acid catalyst; and a solvent.

7 Claims, No Drawings

(56) References Cited

U.S. PATENT DOCUMENTS

| | | | | |
|---|---|---|---|---|
| 9,090,736 | B2* | 7/2015 | Schwalm | ............. C09D 175/16 |
| 2009/0246693 | A1 | 10/2009 | Nakamura et al. | |
| 2019/0317405 | A1* | 10/2019 | Nishita | ................ G03F 7/11 |

FOREIGN PATENT DOCUMENTS

| | | | |
|---|---|---|---|
| JP | 2004-093871 | * | 3/2004 |
| JP | 2004-302371 A | | 10/2004 |
| JP | 2006-084873 A | | 3/2006 |
| JP | 2006-307230 A | | 11/2006 |
| JP | 2008-143920 | * | 6/2008 |
| JP | 2009-108315 A | | 5/2009 |
| JP | 2009-255495 A | | 11/2009 |
| JP | 2010-237491 A | | 10/2010 |
| JP | 2012-108480 A | | 6/2012 |
| JP | 2014-080576 A | | 5/2014 |
| WO | 03/017002 A1 | | 2/2003 |
| WO | 2010/074075 A1 | | 7/2010 |
| WO | 2013/058189 A1 | | 4/2013 |
| WO | 2015/012172 A1 | | 1/2015 |
| WO | 2015/146443 A1 | | 10/2015 |
| WO | WO 2017/086213 | * | 5/2017 |

OTHER PUBLICATIONS

Jansen, J.F.G.A., Dias, A.A., Dorschu, M., Coussens, B.—Fast Monomers: Factors Affecting the Inherent Reactivity of Acrylate Monomers in Protoinitiated Acrylate Polymerization, Macromolecules, 2003, 36, pp. 3861-3873 (Year: 2003).*

Kamps, A.C., Maghitang, T., Nelson, A.—Urea-bearing copolymers for guest-dependent tunable self-assembly, Chem, Commun., 2007,954-956 (Year: 2007).*

Wu, X., Goswami, K., Shimizu, K.D.—Comparison of monofunctional and multifunctional monomers in phosphate binding molecularly imprinted polymers, J. Mol.Recognit.2008, 21, 410-418 (Year: 2008).*

May 1, 2018 Search Report issued in International Patent Application No. PCT/JP2018/003449.

May 1, 2018 Written Opinion of the International Searching Authority issued in International Patent Application No. PCT/JP2018/003449.

May 24, 2023 Office Action issued in Japanese Patent Application No. 2022-047259.

Nov. 29, 2023 Office Action issued in Chinese Patent Application No. 201880004846.9.

* cited by examiner

RESIST UNDERLAYER FILM-FORMING COMPOSITION COMPRISING POLYMER HAVING STRUCTURAL UNIT HAVING UREA LINKAGE

CROSS-REFERENCE TO RELATED APPLICATIONS

This is a national stage application under 35 U.S.C. § 371 of International Patent Application No. PCT/JP2018/003449, filed Feb. 1, 2018, which in turn claims the benefit of priority to JP 2017-018938, filed Feb. 3, 2017. The disclosure of the prior applications is hereby incorporated by reference herein in its entirety.

TECHNICAL FIELD

The present invention relates to a resist underlayer film-forming composition for lithography, particularly to a composition for forming a resist underlayer film having improved adhesion to a resist pattern, and further to a resist underlayer film-forming composition having excellent coating properties on a substrate even in the case of forming a resist underlayer film having a small film thickness (for example, 25 nm or less).

BACKGROUND ART

ArF immersion lithography or extreme ultraviolet (EUV) lithography is demanded to achieve a finer processing dimension for a resist pattern line width. In the formation of such a fine resist pattern, the contact area between the resist pattern and an underlying substrate decreases to increase the aspect ratio of the resist pattern (height of the resist pattern/line width of the resist pattern), and consequently, the resist pattern may easily collapse. Thus, to prevent such collapse, a resist underlayer film or an anti-reflective film that comes into contact with the resist pattern is required to have high adhesion to the resist pattern.

It has been reported that in order to achieve high adhesion to a resist pattern, a resist underlayer film-forming composition containing a lactone structure is used for a resist underlayer film to thereby improve the adhesion of the resist underlayer film to the resulting resist pattern (Patent Document 1). That is, the use of the resist underlayer film-forming composition containing a polar moiety such as a lactone structure is expected to improve the adhesion to a resist pattern, and prevent collapse of even a fine resist pattern.

However, in a lithography process that is required to produce a finer resist pattern, such as ArF immersion lithography or extreme ultraviolet (EUV) lithography, it cannot be said that merely incorporating a lactone structure into a resist underlayer film-forming composition is sufficient to prevent collapse of the resist pattern.

To achieve high adhesion of a resist underlayer film to a resist pattern, Patent Document 2 discloses an additive for a resist underlayer film-forming composition that can suppress the bottom shape of the resist pattern from becoming an undercut shape, by modifying the surface state of the resist underlayer film into a basic state. Patent Document 3, on the other hand, discloses an additive for a resist underlayer film-forming composition that can suppress the bottom shape of a resist pattern from becoming a footing shape, by segregating an additive component near the surface of a resist underlayer film.

Patent Document 4 discloses an additive for a resist underlayer film-forming composition that can improve the adhesion of a resist pattern to a resist underlayer film, by modifying the surface state of the resist underlayer film into a hydrophobic state to reduce the Laplace force during development and rinsing with pure water of the resist pattern. Patent Document 5, on the other hand, discloses an additive for a resist underlayer film-forming composition that can form the cross-sectional shape of a resist pattern into a straight shape, and simultaneously improve the adhesion of the resist pattern to a resist underlayer film, by adjusting the acidity near the surface of the resist underlayer film, in a method for forming a resist pattern in which an unexposed area of a resist film is removed using a solvent that can dissolve the resist film, and an exposed area of the resist film is left as a resist pattern.

Patent Document 6 discloses a resist underlayer film-forming composition for lithography containing a copolymer having a structural unit in which a sulfo group has been introduced into an end; a crosslinking agent; and a solvent. The invention disclosed in Patent Document 6 achieves the effect of suppressing the generation of a sublimate derived from a crosslinking catalyst component in the formation of a resist underlayer film, and can provide a resist underlayer film that allows the formation of a resist pattern having a good shape, which has substantially no footing shape in a lower portion thereof.

PRIOR ART DOCUMENTS

Patent Documents

Patent Document 1: International publication WO 03/017002
Patent Document 2: International publication WO 2013/058189
Patent Document 3: International publication WO 2010/074075
Patent Document 4: International publication WO 2015/012172
Patent Document 5: International publication WO 2015/146443
Patent Document 6: Japanese Patent Application Publication No. 2010-237491 (JP 2010-237491 A)

SUMMARY OF THE INVENTION

Problem to be Solved by the Invention

It is an object of the present invention to provide a resist underlayer film-forming composition having a dramatically improved crosslinking ability over conventional compositions, by adopting a polymer having a urea linkage (—NH—C(=O)—NH—) as a side chain. It is another object of the present invention to provide a resist underlayer film-forming composition that crosslinks with a component of a resist material, in order to improve the adhesion of a resist underlayer film to a resist pattern.

Means for Solving the Problem

To achieve the above-described objects, a copolymer having a urea linkage and having an isocyanate group blocked with a protecting group is adopted in a resist underlayer film-forming composition. In summary, a first aspect of the present invention is a resist underlayer film-forming composition for lithography comprising:
  a copolymer having a structural unit of formula (1) and a structural unit of formula (2):

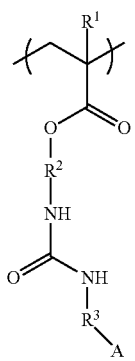

(1)

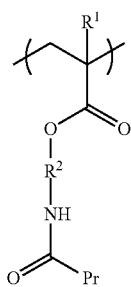

(2)

(wherein each $R^1$ is independently a hydrogen atom or a methyl group; each $R^2$ is independently a $C_{1-3}$ alkylene group; $R^3$ is a single bond or a methylene group; A is a linear, branched, or cyclic aliphatic group having a carbon atom number of 1 to 12 and optionally having a substituent, or a $C_{6-16}$ aromatic or heterocyclic group optionally having a substituent; and Pr is a protecting group);

a crosslinking agent;

an organic acid catalyst; and a solvent.

The copolymer may have, in addition to the structural unit of formula (1) and the structural unit of formula (2), a structural unit of formula (3):

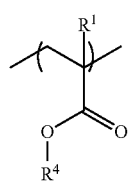

(3)

(wherein $R^1$ is as defined in formula (1) above; and $R^4$ is a linear, branched, or cyclic aliphatic group having a carbon atom number of 1 to 12, in which at least one hydrogen atom is substituted with a fluoro group, the aliphatic group optionally further having at least one hydroxy group as a substituent).

The structural unit of formula (1) is, for example, any of structural units of formulae (1a) to (1j):

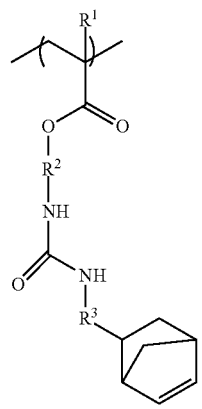

(1a)

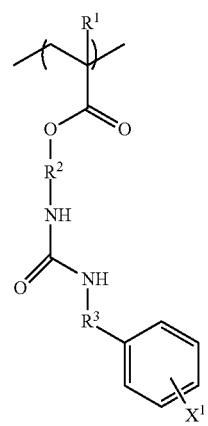

(1b)

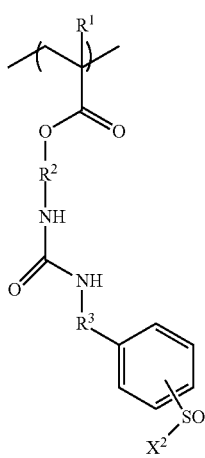

(1c)

(1d)
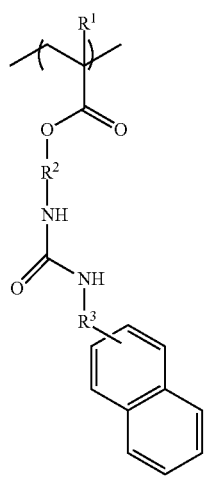
(1e)
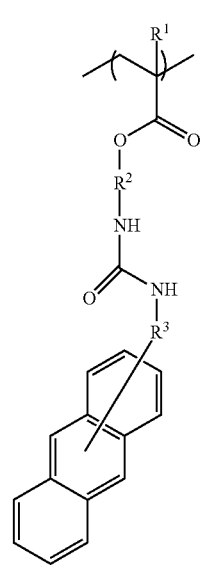
(1f)
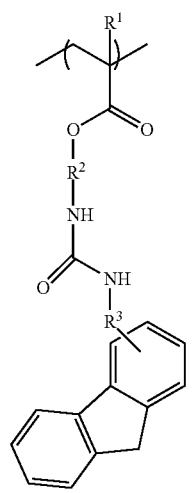
(1g)
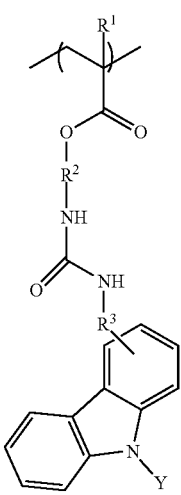
(1h)
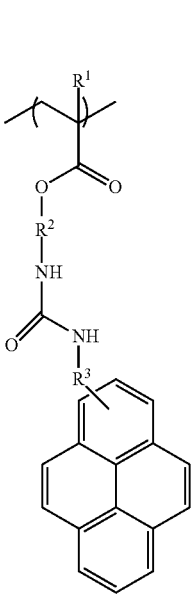
(1i)
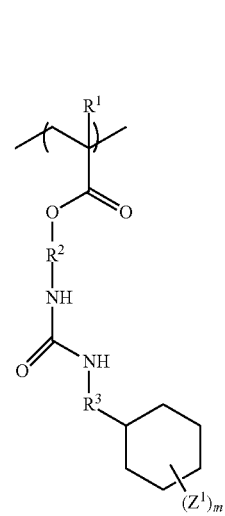

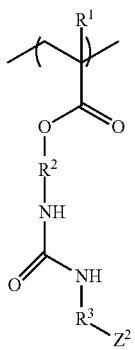

(1j)

(wherein R¹, R², and R³ are as defined in formula (1) above; X¹ and X² are each independently a hydrogen atom, a hydroxy group, a halogeno group, or a methyl group in which at least one hydrogen atom is optionally substituted with a fluoro group; Y is a hydrogen atom, a methyl group, or an ethyl group; Z¹ and Z² are each independently a linear or branched alkyl group having a carbon atom number of 1 to 3, in which at least one hydrogen atom is optionally substituted with a fluoro group or a hydroxy group; and m is an integer from 0 to 2).

The structural unit of formula (2) is, for example, a structural unit of formula (2a), a structural unit of formula (2b), a structural unit of formula (2c), or a structural unit of formula (2d):

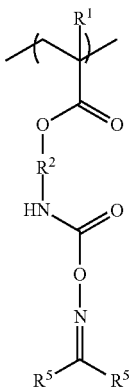

(2a)

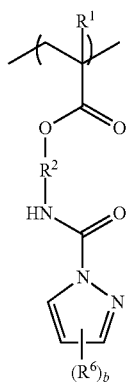

(2b)

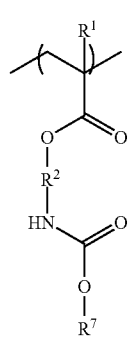

(2c)

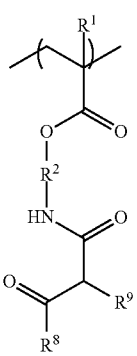

(2d)

(wherein R¹ and R² are as defined in formula (1) above; two R⁵s are each independently a hydrogen atom, a methyl group, or an ethyl group; R⁶ is a methyl group or an ethyl group; b is an integer from 0 to 3; R⁷ is a linear or branched alkyl group having a carbon atom number of 1 to 6, or a linear or branched alkoxyalkyl group having a carbon atom number of 1 to 6; R⁸ is a linear or branched alkoxy group having a carbon atom number of 1 to 6; and R⁹ is a hydrogen atom, or a linear or branched alkoxycarbonyl group having a carbon atom number of 2 to 6).

The copolymer has a weight average molecular weight of 1,500 to 20,000, for example, and preferably 3,000 to 15,000. In the case where the weight average molecular weight is less than 1,500, solvent resistance cannot be obtained for the resist underlayer film formed from the resist underlayer film-forming composition containing the copolymer; whereas in the case where the weight average molecular weight is more than 20,000, the solubility of the copolymer in the solvent may deteriorate in the preparation of the resist underlayer film-forming composition.

A second aspect of the present invention is a method for forming a resist pattern comprising the steps of:
    forming a resist underlayer film having a thickness of 1 to 25 nm by applying the resist underlayer film-forming composition for lithography according to the first aspect of the present invention onto a substrate, and baking the composition;
    forming a resist film by applying a resist solution onto the resist underlayer film, and heating the resist solution;
    exposing the resist film to radiation selected from the group consisting of a KrF excimer laser, an ArF excimer laser, and extreme ultraviolet radiation through a photomask; and
    after the exposure, developing the resist film with a developer.

A third aspect of the present invention is a monomer of formula (a), (b), (c), (d), (e), (f), (g), (h), (i), or (j):
(a)
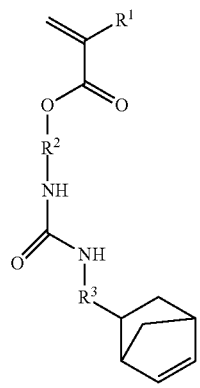
(b)
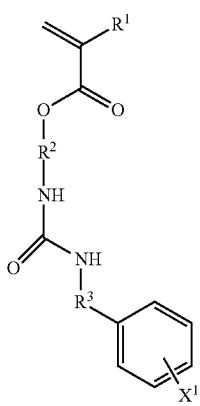
(c)
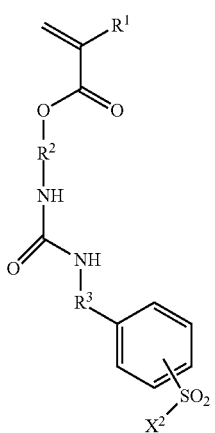
-continued
(d)
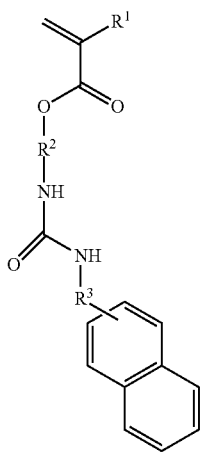
(e)
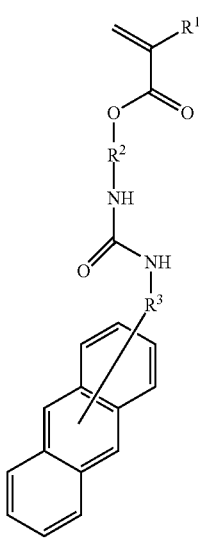
(f)
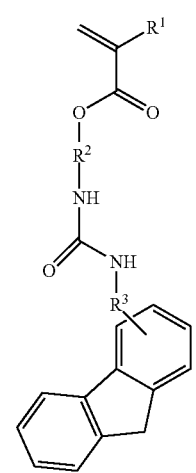

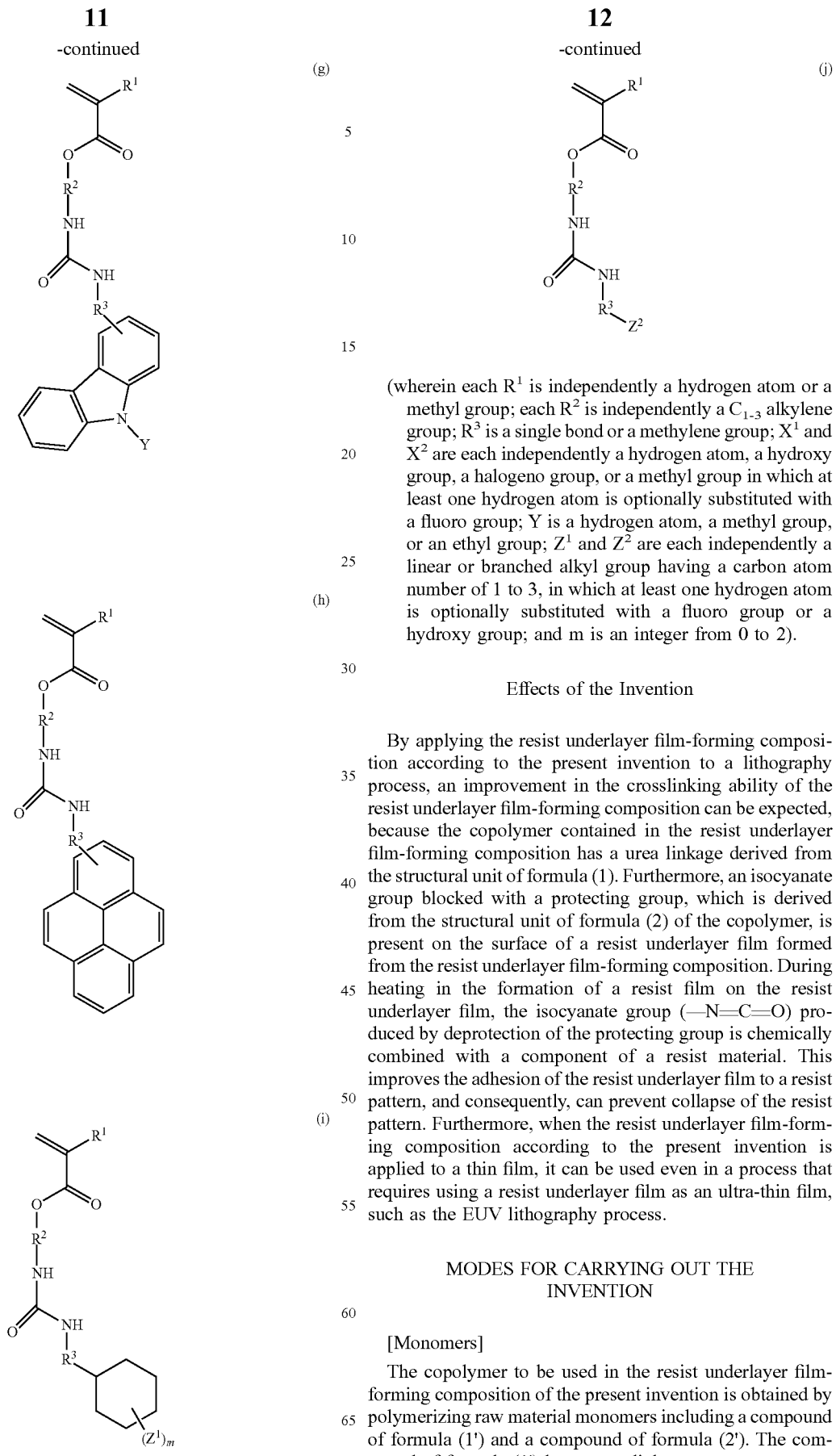

(wherein each $R^1$ is independently a hydrogen atom or a methyl group; each $R^2$ is independently a $C_{1-3}$ alkylene group; $R^3$ is a single bond or a methylene group; $X^1$ and $X^2$ are each independently a hydrogen atom, a hydroxy group, a halogeno group, or a methyl group in which at least one hydrogen atom is optionally substituted with a fluoro group; Y is a hydrogen atom, a methyl group, or an ethyl group; $Z^1$ and $Z^2$ are each independently a linear or branched alkyl group having a carbon atom number of 1 to 3, in which at least one hydrogen atom is optionally substituted with a fluoro group or a hydroxy group; and m is an integer from 0 to 2).

Effects of the Invention

By applying the resist underlayer film-forming composition according to the present invention to a lithography process, an improvement in the crosslinking ability of the resist underlayer film-forming composition can be expected, because the copolymer contained in the resist underlayer film-forming composition has a urea linkage derived from the structural unit of formula (1). Furthermore, an isocyanate group blocked with a protecting group, which is derived from the structural unit of formula (2) of the copolymer, is present on the surface of a resist underlayer film formed from the resist underlayer film-forming composition. During heating in the formation of a resist film on the resist underlayer film, the isocyanate group (—N═C═O) produced by deprotection of the protecting group is chemically combined with a component of a resist material. This improves the adhesion of the resist underlayer film to a resist pattern, and consequently, can prevent collapse of the resist pattern. Furthermore, when the resist underlayer film-forming composition according to the present invention is applied to a thin film, it can be used even in a process that requires using a resist underlayer film as an ultra-thin film, such as the EUV lithography process.

MODES FOR CARRYING OUT THE INVENTION

[Monomers]

The copolymer to be used in the resist underlayer film-forming composition of the present invention is obtained by polymerizing raw material monomers including a compound of formula (1') and a compound of formula (2'). The compound of formula (1') has a urea linkage.

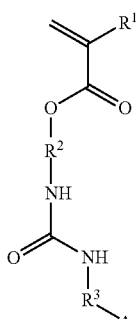

(1')

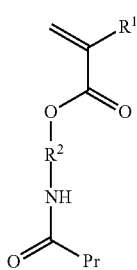

(2')

(wherein each $R^1$ is independently a hydrogen atom or a methyl group; each $R^2$ is independently a $C_{1-3}$ alkylene group; $R^3$ is a single bond or a methylene group; A is a linear, branched, or cyclic aliphatic group having a carbon atom number of 1 to 12 and optionally having a substituent, or a $C_{6-16}$ aromatic or heterocyclic group optionally having a substituent; and Pr is a protecting group.)

When the substituent is a halogeno group, examples of the halogeno group include fluoro group, chloro group, bromo group, and iodo group.

Examples of the compound of formula (1') include compounds of formulae (a-1) and (a-2), (b-1) to (b-8), (c-1) and (c-2), (d-1) and (d-2), (e-1) to (e-4), (f-1) and (f-2), (g-1) and (g-2), (h-1) and (h-2), (i-1) to (i-10), and (j-1) to (j-4):

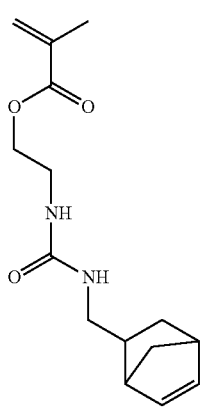

(a-1)

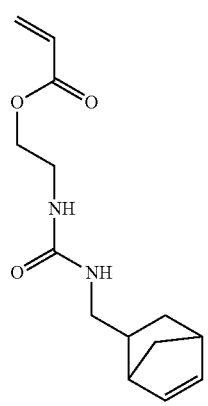

(a-2)

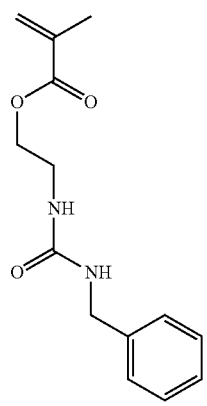

(b-1)

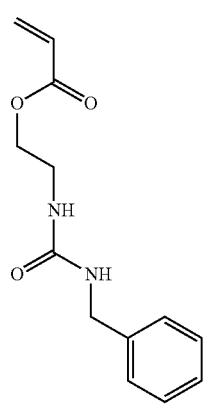

(b-2)

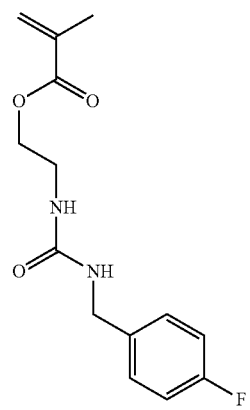

(b-3)

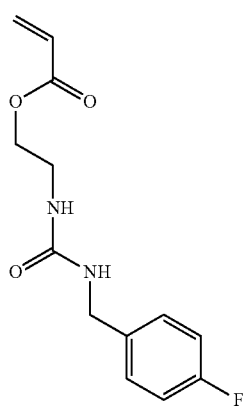
(b-4)
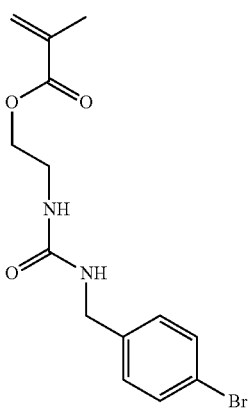
(b-5)
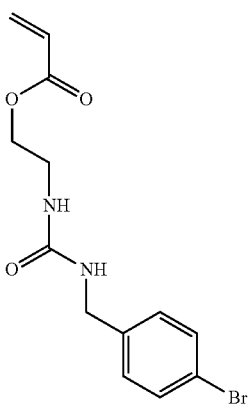
(b-6)
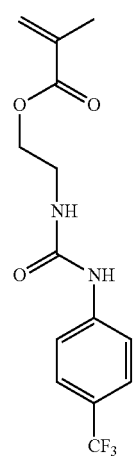
(b-7)
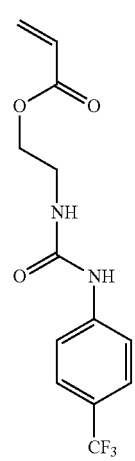
(b-8)
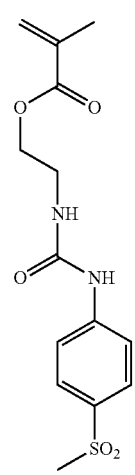
(c-1)

(c-2)
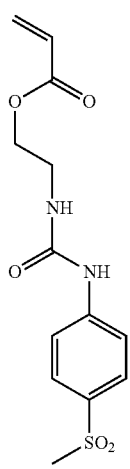
(d-1)
(d-2)
(e-1)
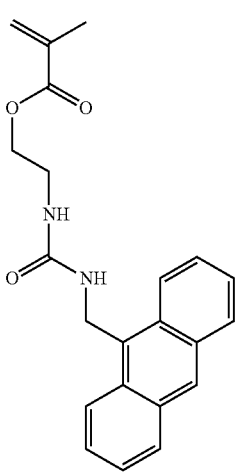
(e-2)
(e-3)
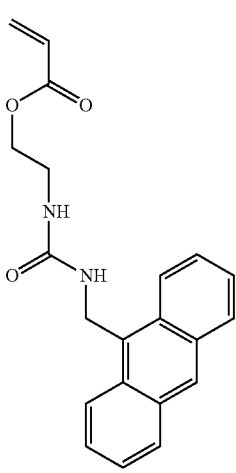

(e-4)
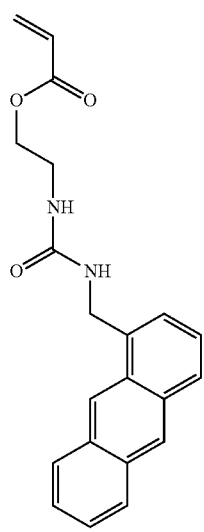
(f-1)
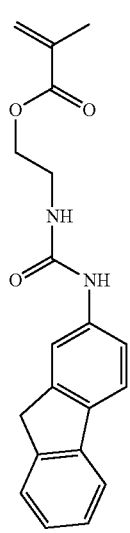
(f-2)
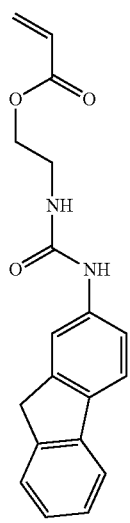
(g-1)
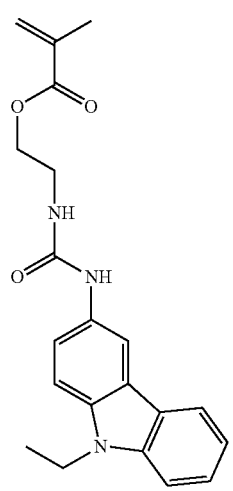
(g-2)
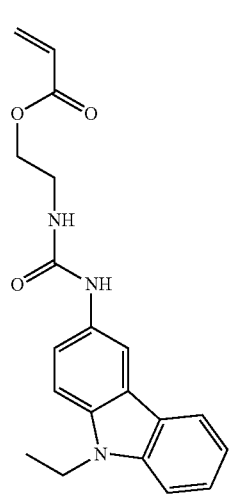
(h-1)
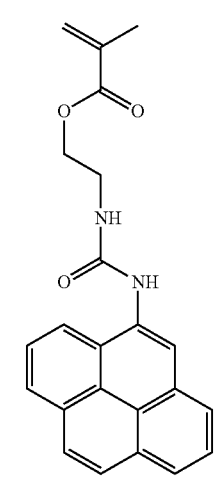

(h-2)
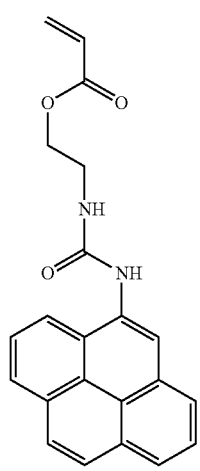
(i-1)
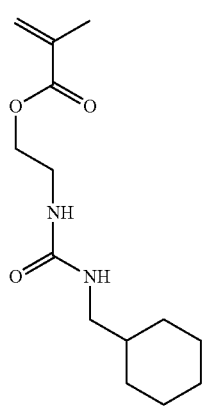
(i-2)
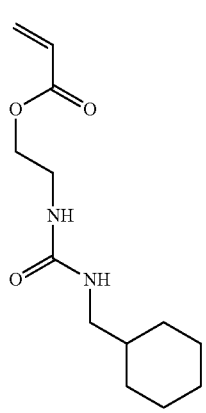
(i-3)
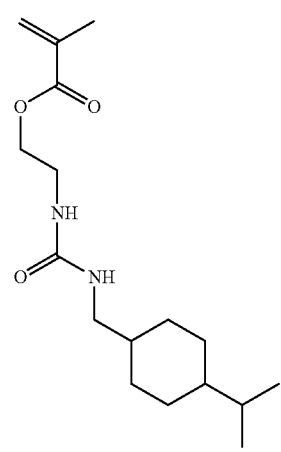
(i-4)
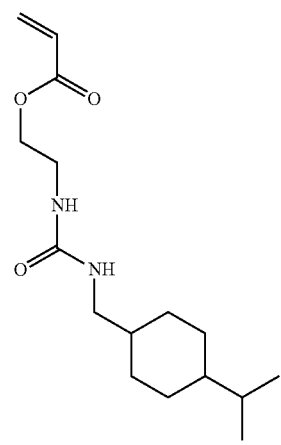
(i-5)
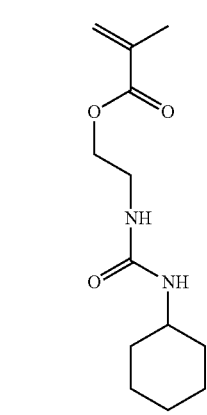

(i-6)
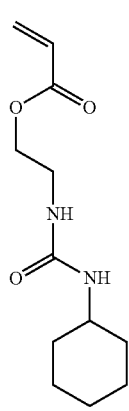
(i-7)
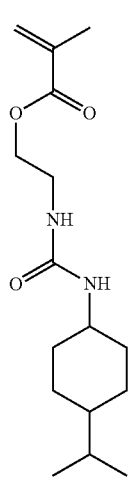
(i-8)
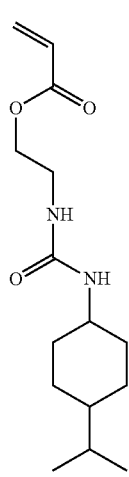
(i-9)
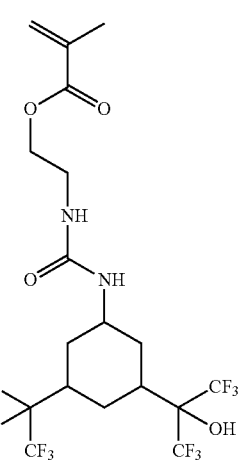
(i-10)
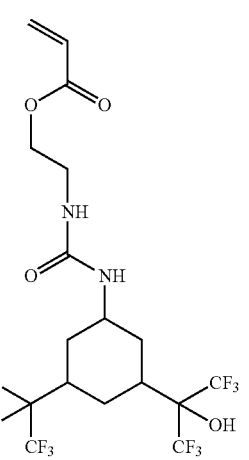
(j-1)
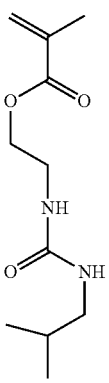
(j-2)
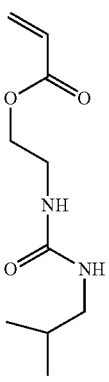

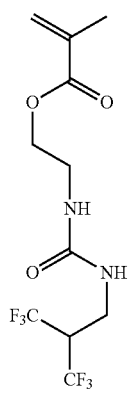 (j-3)

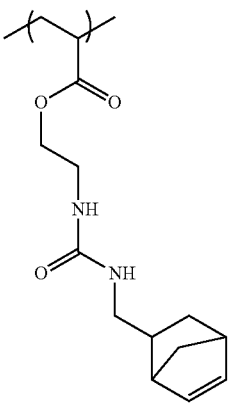 (1a-2)

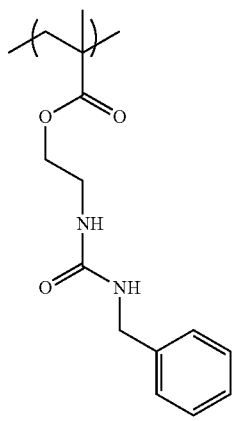 (1b-1)

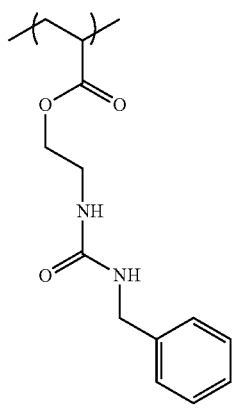 (1b-2)

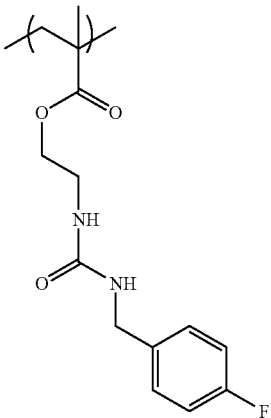 (1b-3)

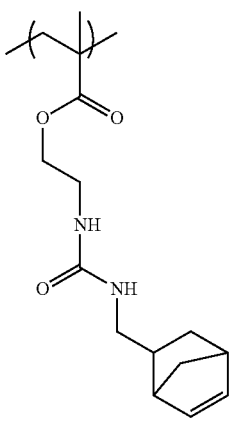 (1a-1)

[Copolymer]

The copolymer to be used in the resist underlayer film-forming composition of the present invention has the structural unit of formula (1) and the structural unit of formula (2), and may further have the structural unit of formula (3).

Examples of the structural unit of formula (1) include structural units of formulae (1a-1) and (1a-2), (1b-1) to (1b-8), (1c-1) and (1c-2), (1d-1) and (1d-2), (1e-1) to (1e-4), (1f-1) and (1f-2), (1g-1) and (1g-2), (1h-1) and (1h-2), (1i-1) to (1i-10), and (1j-1) to (1j-4):

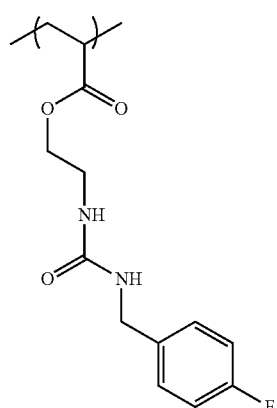
(1b-4)
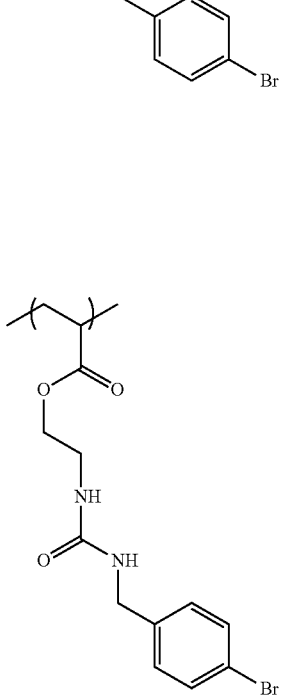
(1b-5)
(1b-6)
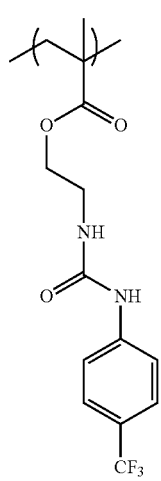
(1b-7)
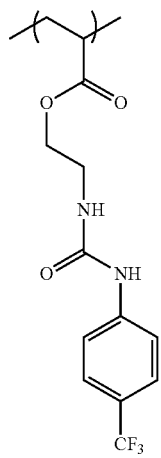
(1b-8)
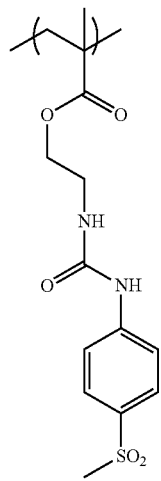
(1c-1)

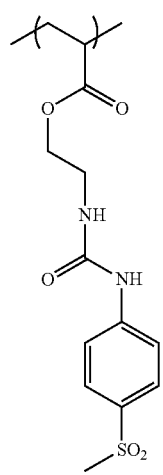 (1c-2)
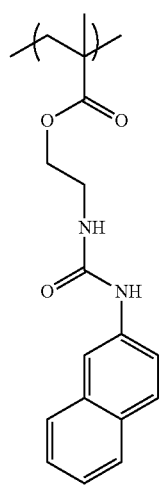 (1d-1)
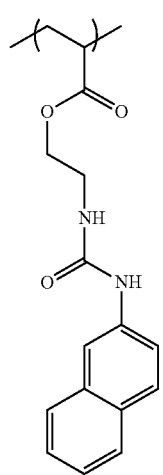 (1d-2)
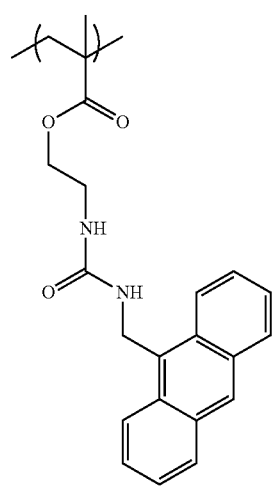 (1e-1)
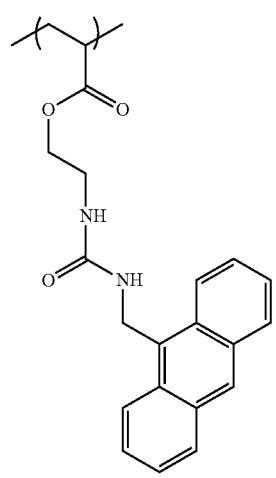 (1e-2)
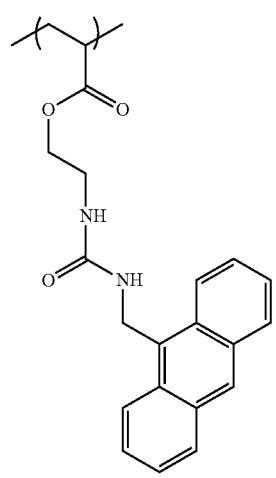 (1e-3)

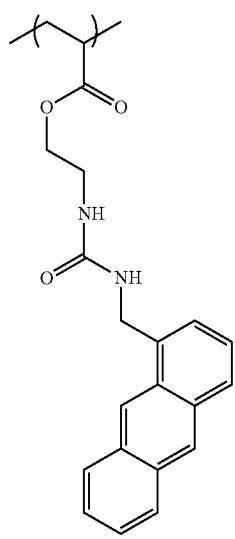
(1e-4)
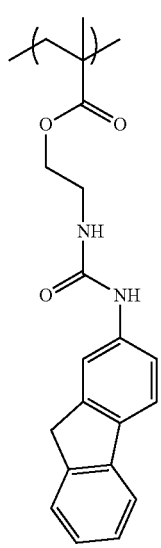
(1f-1)
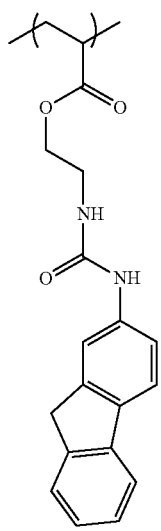
(1f-2)
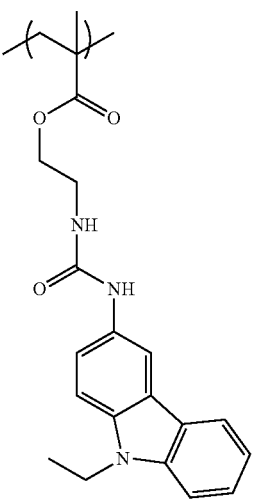
(1g-1)
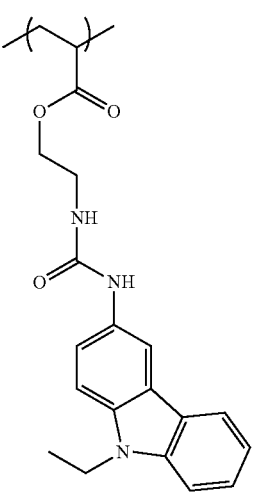
(1g-2)
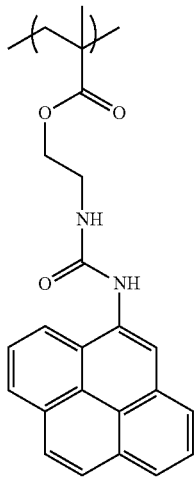
(1h-1)

(1h-2)
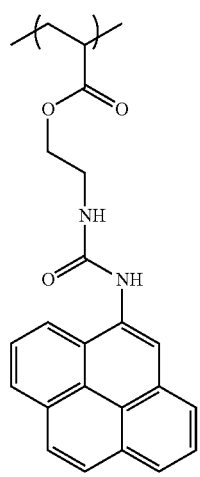
(1i-1)
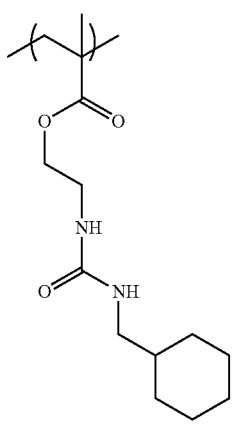
(1i-2)
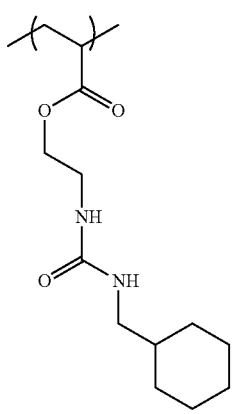
(1i-3)
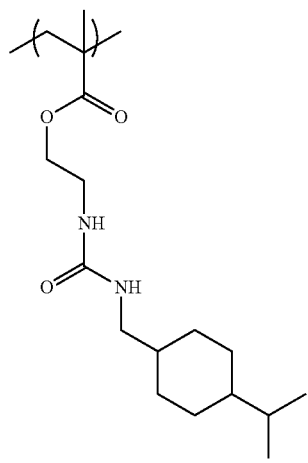
(1i-4)
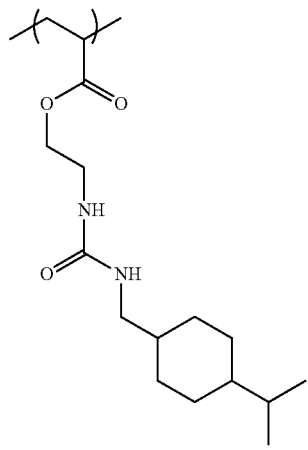
(1i-5)
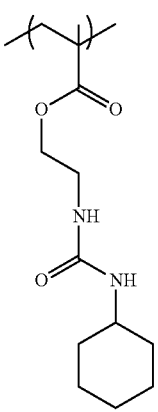

(1i-6) 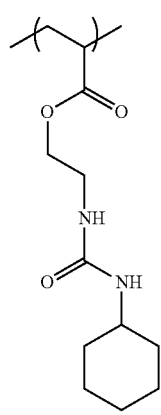
(1i-7) 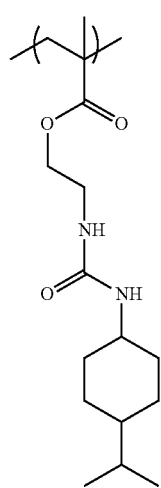
(1i-8) 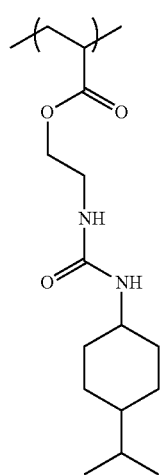
(1i-9) 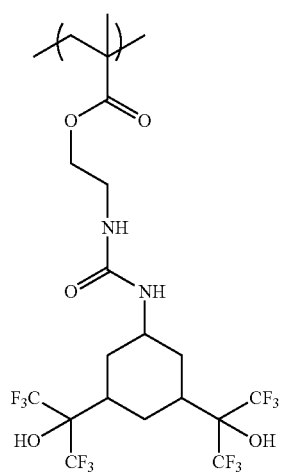
(1i-10) 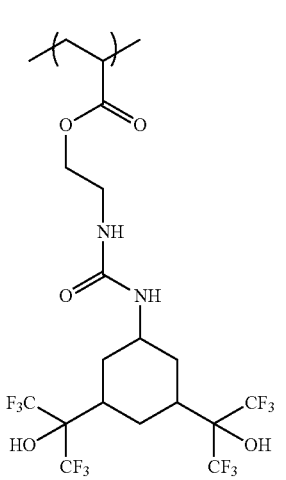
(1j-1) 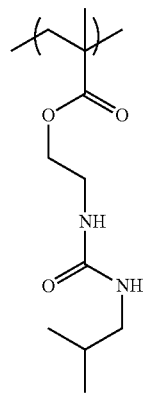

(1j-2) 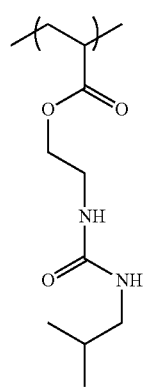
(1j-3) 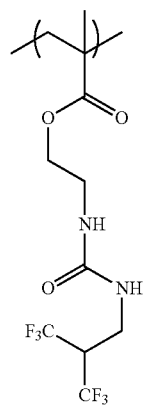
(1j-4) 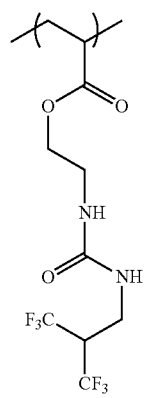
The structural unit of formula (2) has an isocyanate group blocked with a protecting group. When the protecting group is deprotected by heating, the isocyanate group is produced. Examples of this structural unit include structural units of formulae (2a-1), (2a-2), (2b-1), (2b-2), (2c-1) to (2c-14), (2d-1) and (2d-2):
(2a-1) 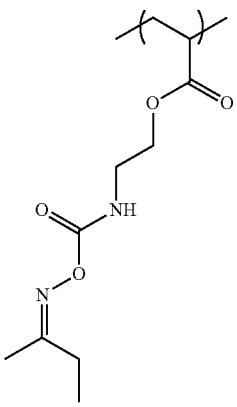
(2a-2) 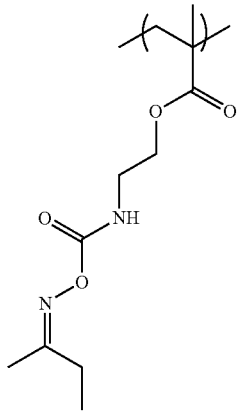
(2b-1) 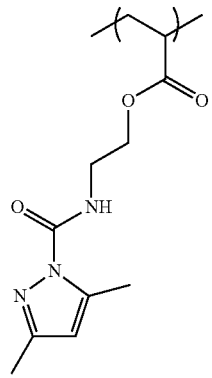
(2b-2) 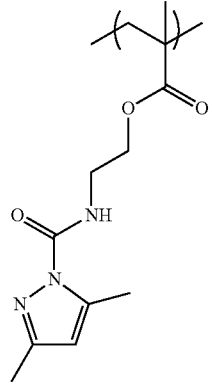

(2c-1)

(2c-2)

(2c-3)

(2c-4)

(2c-5)

(2c-6)

(2c-7)

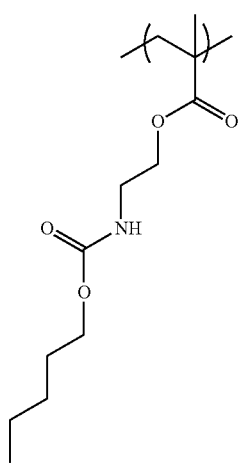 (2c-8)
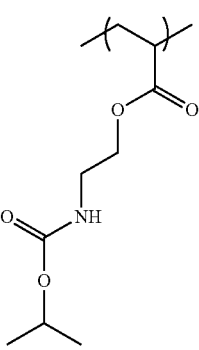 (2c-11)
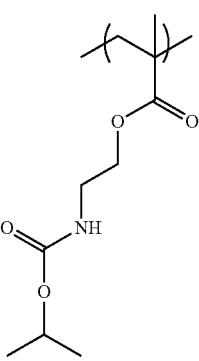 (2c-12)
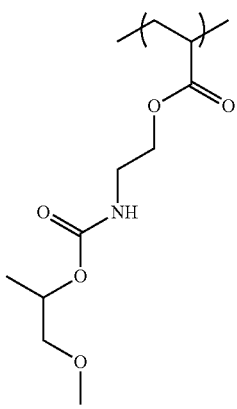 (2c-13)
(2c-9)
(2c-10)
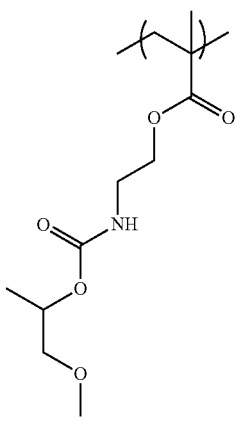 (2c-14)

(2d-1)

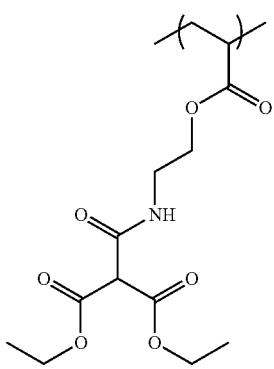

(2d-2)

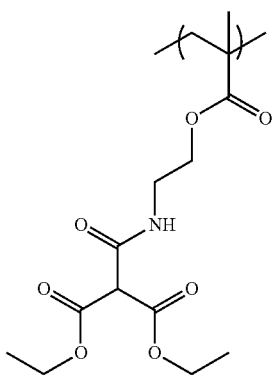

Examples of the structural unit of formula (3) include structural units of formulae (3-1) to (3-6). The structural unit of formula (3) serves to make a film prepared from the composition containing the copolymer having this structural unit hydrophobic, and serves to improve the coating properties of the composition.

(3-1)

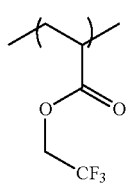

(3-2)

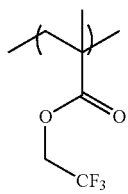

(3-3)

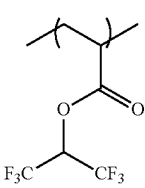

(3-4)

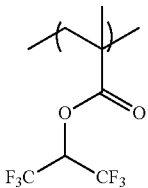

(3-5)

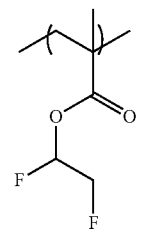

(3-6)

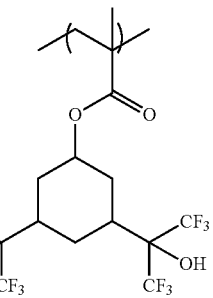

[Crosslinking Agent]

The resist underlayer film-forming composition of the present invention further contains a crosslinking agent. Examples of the crosslinking agent include hexamethoxymethylmelamine, tetramethoxymethylbenzoguanamine, 1,3,4,6-tetrakis(methoxymethyl)glycoluril (trade name: POWDERLINK 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea. The content of the crosslinking agent is, for example, 1 to 30% by mass, based on the copolymer.

[Organic Acid Catalyst]

The resist underlayer film-forming composition of the present invention further contains an organic acid catalyst. The organic acid catalyst is a catalyst component that accelerates a crosslinking reaction, and examples thereof include sulfonic acid compounds and carboxylic acid compounds, such as p-toluenesulfonic acid, trifluoromethanesulfonic acid, pyridinium p-toluenesulfonate, pyridinium p-hydroxybenzenesulfonate, salicylic acid, camphor sulfonic acid, 5-sulfosalicylic acid, 4-chlorobenzenesulfonic acid, 4-phenolsulfonic acid, methyl 4-phenolsulfonate, benzenedisulfonic acid, 1-naphthalenesulfonic acid, citric acid, benzoic acid, and hydroxybenzoic acid. These organic acid catalysts may be contained alone, or in combination of two or more. The content of the organic acid catalyst is, for example, 0.1 to 20% by mass, based on the crosslinking agent.

[Solvent]

The resist underlayer film-forming composition of the present invention further contains a solvent. Examples of the solvent include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more selected from these solvents. The content of the solvent is, for example, 50 to 99.5% by mass, based on the resist underlayer film-forming composition.

[Other Additives]

The resist underlayer film-forming composition of the present invention may further contain a surfactant, as required. The surfactant is an additive for improving the coating properties of the resist underlayer film-forming composition on a substrate. A known surfactant such as a nonionic surfactant or a fluorosurfactant can be used. Specific examples of the surfactant include nonionic surfactants including polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenyl ether and polyoxyethylene nonylphenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants including EFTOP [registered trademark] EF301, EF303, and EF352 (from Mitsubishi Materials Electronic Chemicals Co., Ltd.), MEGAFACE [registered trademark] F171, F173, R-30, R-40, and R-40-LM (from DIC Corporation), Fluorad FC430 and FC431 (from Sumitomo 3M Co., Ltd.), AsahiGuard [registered trademark] AG710, and Surflon [registered trademark] S-382, SC101, SC102, SC103, SC104, SC105, and SC106 (from Asahi Glass Co., Ltd.); and organosiloxane polymer KP341 (from Shin-Etsu Chemical Co., Ltd.). These surfactants may be contained alone, or in combination of two or more. When the resist underlayer film-forming composition contains a surfactant, the content of the surfactant is, for example, 0.1 to 5% by mass, and preferably 0.2 to 3% by mass, based on the copolymer.

EXAMPLES

The weight average molecular weights shown herein in Synthesis Examples 4 to 7 below were measured by gel permeation chromatography (hereinafter abbreviated as GPC). The measurement was performed using a GPC apparatus from Tosoh Corporation. The degree of distribution shown herein in each of the following synthesis examples was calculated from the measured weight average molecular weight and the number average molecular weight.

Synthesis of Raw Material Monomers

Synthesis Example 1

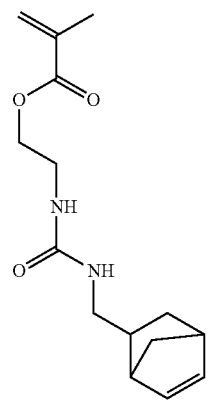

(a-1)

15.00 g of 2-isocyanatoethyl methacrylate (from Showa Denko K.K., trade name: Karenz [registered trademark] MOI) and 75.00 g of tetrahydrofuran (hereinafter abbreviated as THF) were placed, and a solution obtained by mixing 11.91 g of 5-norbornene-2-methylamine (from Tokyo Chemical Industry Co., Ltd.) and 75.00 g of THF at below 30° C. was added thereto. The mixture was stirred at 25° C. for 1 hour, the resulting reaction solution was concentrated, and the concentrate was further dried to obtain 26.79 g of a compound of formula (a-1) having a urea linkage as a solid (yield 99.6%).

Synthesis Example 2

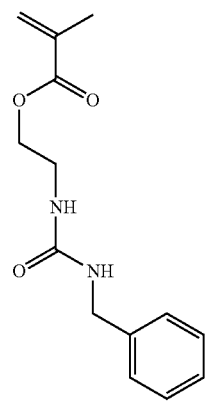

(b-1)

10.00 g of 2-isocyanatoethyl methacrylate (from Showa Denko K.K., trade name: Karenz [registered trademark] MOI) and 50.00 g of THF were placed, and a solution obtained by mixing 6.92 g of benzylamine (from Tokyo Chemical Industry Co., Ltd.) and 50.00 g of THF at below 30° C. was added thereto. The mixture was stirred at 25° C. for 1 hour, the resulting reaction solution was concentrated, and the concentrate was further dried to obtain 16.62 g of a compound of formula (b-1) having a urea linkage as a solid (yield 98.3%).

Synthesis Example 3

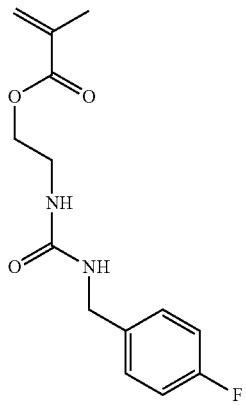

(b-3)

10.00 g of 2-isocyanatoethyl methacrylate (from Showa Denko K.K., trade name: Karenz [registered trademark] MOI) and 50.00 g of THF were placed, and a solution obtained by mixing 8.07 g of 4-fluorobenzylamine (from Tokyo Chemical Industry Co., Ltd.) and 50.00 g of THF at below 30° C. was added thereto. The mixture was stirred at 25° C. for 2 hours, the resulting reaction solution was concentrated, and the concentrate was further dried to obtain 18.00 g of a compound of formula (b-3) having a urea linkage as a solid (yield 99.6%).

Synthesis of Copolymers

Synthesis Example 4

32.50 g of propylene glycol monomethyl ether was added to 5.80 g of 2-(O-[1'-methylpropylideneamino]carboxyamino)ethyl methacrylate (from Showa Denko K.K., trade name: Karenz [registered trademark] MOI-BM), 4.00 g of the compound obtained in Synthesis Example 1, 2.26 g of 1,1,1,3,3,3-hexafluoroisopropyl methacrylate (from Tokyo Chemical Industry Co., Ltd.), and 0.48 g of 1-dodecanethiol (from Tokyo Chemical Industry Co., Ltd.), and then the flask was purged with nitrogen and heated to 70° C. As a polymerization initiator, 0.39 g of azobisisobutyronitrile (AIBN) dissolved in 19.27 g of propylene glycol monomethyl ether was added into the flask under pressurization with nitrogen, and the contents were reacted for 24 hours to obtain a solution containing a copolymer having a structural unit of formula (1a-1), a structural unit of formula (2a-2), and a structural unit of formula (3-4). GPC analysis of the resulting solution containing the copolymer showed that the copolymer in the solution had a weight average molecular weight of 7,600 relative to standard polystyrene, and had a degree of distribution of 2.10.

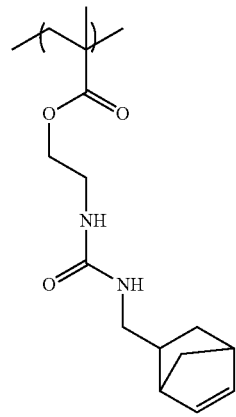

(1a-1)

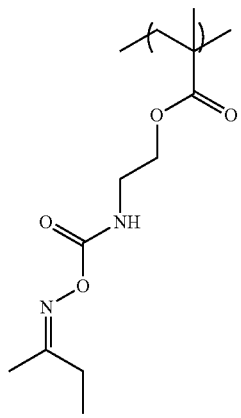

(2a-2)

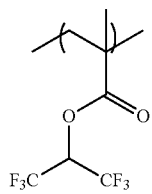

(3-4)

Synthesis Example 5

33.51 g of propylene glycol monomethyl ether was added to 6.16 g of 2-(O-[1'-methylpropylideneamino]carboxyamino)ethyl methacrylate (from Showa Denko K.K., trade name: Karenz [registered trademark] MOI-BM), 4.00 g of the compound obtained in Synthesis Example 2, 2.40 g of 1,1,1,3,3,3-hexafluoroisopropyl methacrylate (from Tokyo Chemical Industry Co., Ltd.), and 0.51 g of 1-dodecanethiol (from Tokyo Chemical Industry Co., Ltd.), and then the flask was purged with nitrogen and heated to 70° C. As a polymerization initiator, 0.41 g of azobisisobutyronitrile (AIBN) dissolved in 20.45 g of propylene glycol monomethyl ether was added into the flask under pressurization with nitrogen, and the contents were reacted for 24 hours to obtain a solution containing a copolymer having a structural unit of formula (1b-1), a structural unit of formula (2a-2), and a structural unit of formula (3-4). GPC analysis of the resulting solution containing the copolymer showed that the copolymer in the solution had a weight average molecular weight of 6,200 relative to standard polystyrene, and had a degree of distribution of 3.28.

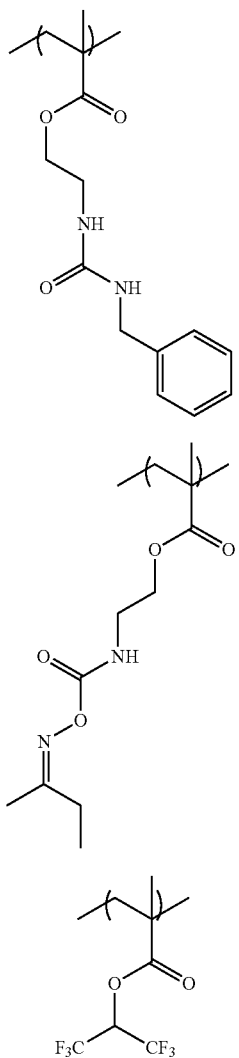

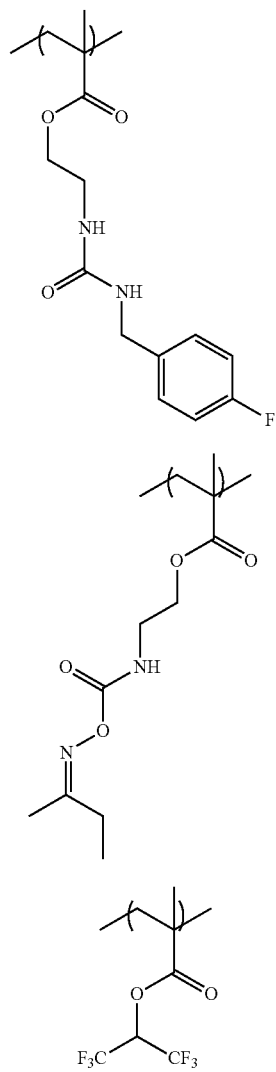

Synthesis Example 6

32.38 g of propylene glycol monomethyl ether was added to 5.76 g of 2-(O-[1'-methylpropylideneamino]carboxyamino)ethyl methacrylate (from Showa Denko K.K., trade name: Karenz [registered trademark] MOI-BM), 4.00 g of the compound obtained in Synthesis Example 3, 2.25 g of 1,1,1,3,3,3-hexafluoroisopropyl methacrylate (from Tokyo Chemical Industry Co., Ltd.), and 1.53 g of 1-dodecanethiol (from Tokyo Chemical Industry Co., Ltd.), and then the flask was purged with nitrogen and heated to 70° C. As a polymerization initiator, 0.39 g of azobisisobutyronitrile (AIBN) dissolved in 19.14 g of propylene glycol monomethyl ether was added into the flask under pressurization with nitrogen, and the contents were reacted for 24 hours to obtain a solution containing a copolymer having a structural unit of formula (1b-3), a structural unit of formula (2a-2), and a structural unit of formula (3-4). GPC analysis of the resulting solution containing the copolymer showed that the copolymer in the solution had a weight average molecular weight of 5,480 relative to standard polystyrene, and had a degree of distribution of 2.61.

Synthesis Example 7

92.11 g of propylene glycol monomethyl ether was added to 18.33 g of 2-(O-[1'-methylpropylideneamino]carboxyamino)ethyl methacrylate (from Showa Denko K.K., trade name: Karenz [registered trademark] MOI-BM), 10.00 g of adamantyl methacrylate (from Osaka Organic Chemical Industry Ltd.), 7.14 g of 1,1,1,3,3,3-hexafluoroisopropyl methacrylate (from Tokyo Chemical Industry Co., Ltd.), and 1.53 g of 1-dodecanethiol (from Tokyo Chemical Industry Co., Ltd.), and then the flask was purged with nitrogen and heated to 70° C. As a polymerization initiator, 1.24 g of azobisisobutyronitrile (AIBN) dissolved in 60.87 g of propylene glycol monomethyl ether was added into the flask under pressurization with nitrogen, and the contents were reacted for 24 hours to obtain a solution containing a copolymer having a structural unit of formula (2a-2), a structural unit of formula (4), and a structural unit of formula (3-4). GPC analysis of the resulting solution containing the copolymer showed that the copolymer in the solution had a weight average molecular weight of 6,070 relative to standard polystyrene, and had a degree of distribution of 1.98.

(2a-2)

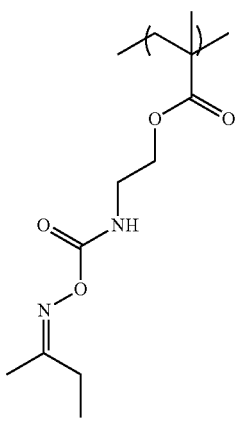

(5)

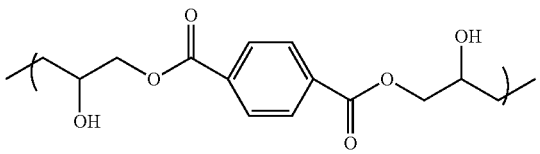

(6)

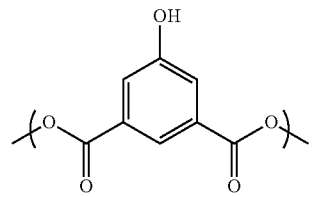

(4)

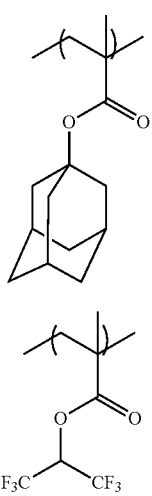

(3-4)

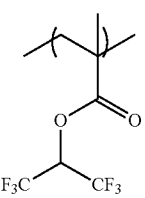

Synthesis Example 8

20.00 g of terephthalic acid diglycidyl ester (from Nagase Chemtex Corporation, trade name: DENACOL [registered trademark] EX711), 12.54 g of 5-hydroxyisophthalic acid (from Tokyo Chemical Industry Co., Ltd.), and 1.28 g of ethyltriphenylphosphonium bromide (from Sigma Aldrich Co. LLC.) were added to 135.27 g of propylene glycol monomethyl ether and dissolved. The reaction vessel was purged with nitrogen, and then the contents were reacted at 135° C. for 4 hours to obtain a solution containing a copolymer having a structural unit of formula (5) and a structural unit of formula (6). The solution did not show cloudiness or the like even though it was cooled to room temperature, and had good solubility in propylene glycol monomethyl ether. GPC analysis of the resulting solution containing the copolymer showed that the copolymer in the solution had a weight average molecular weight of 6,758 relative to standard polystyrene, and had a degree of distribution of 1.64.

Example 1

0.96 g of the solution containing 0.06 g of the copolymer obtained in Synthesis Example 4 above was mixed with 0.039 g of tetramethoxymethylglycoluril (from Nihon Cytec Industries Inc., trade name: POWDERLINK 1174) and 0.0049 g of pyridinium p-toluenesulfonate (from Tokyo Chemical Industry Co., Ltd.), and then 13.05 g of propylene glycol monomethyl ether and 5.94 g of propylene glycol monomethyl ether acetate were added thereto, and the mixture was dissolved. The solution was subsequently filtered through a polyethylene microfilter having a pore size of 0.05 μm, thus obtaining a resist underlayer film-forming composition for lithography.

Example 2

1.01 g of the solution containing 0.16 g of the copolymer obtained in Synthesis Example 5 above was mixed with 0.039 g of tetramethoxymethylglycoluril (from Nihon Cytec Industries Inc., trade name: POWDERLINK 1174) and 0.0049 g of pyridinium p-toluenesulfonate (from Tokyo Chemical Industry Co., Ltd.), and then 13.00 g of propylene glycol monomethyl ether and 5.94 g of propylene glycol monomethyl ether acetate were added thereto, and the mixture was dissolved. The solution was subsequently filtered through a polyethylene microfilter having a pore size of 0.05 μm, thus obtaining a resist underlayer film-forming composition for lithography.

Example 3

1.01 g of the solution containing 0.16 g of the copolymer obtained in Synthesis Example 6 above was mixed with 0.039 g of tetramethoxymethylglycoluril (from Nihon Cytec Industries Inc., trade name: POWDERLINK 1174) and 0.0049 g of pyridinium p-toluenesulfonate (from Tokyo Chemical Industry Co., Ltd.), and then 13.04 g of propylene glycol monomethyl ether and 5.94 g of propylene glycol monomethyl ether acetate were added thereto, and the mixture was dissolved. The solution was subsequently filtered through a polyethylene microfilter having a pore size of 0.05 μm, thus obtaining a resist underlayer film-forming composition for lithography.

Comparative Example 1

0.92 g of the solution containing 0.16 g of the copolymer obtained in Synthesis Example 7 above was mixed with 0.039 g of tetramethoxymethylglycoluril (from Nihon Cytec Industries Inc., trade name: POWDERLINK 1174) and 0.0049 g of pyridinium p-toluenesulfonate (from Tokyo Chemical Industry Co., Ltd.), and then 13.00 g of propylene glycol monomethyl ether and 5.94 g of propylene glycol monomethyl ether acetate were added thereto, and the mixture was dissolved. The solution was subsequently filtered through a polyethylene microfilter having a pore size of 0.05 µm, thus obtaining a resist underlayer film-forming composition for lithography.

Comparative Example 2

0.98 g of the solution containing 0.16 g of the copolymer obtained in Synthesis Example 8 above was mixed with 0.039 g of tetramethoxymethylglycoluril (from Nihon Cytec Industries Inc., trade name: POWDERLINK 1174), 0.0039 g of 5-sulfosalicylic acid (from Tokyo Chemical Industry Co., Ltd.), and 0.00078 g of R-30 (from DIC Corporation), and then 13.03 g of propylene glycol monomethyl ether and 5.94 g of propylene glycol monomethyl ether acetate were added thereto, and the mixture was dissolved. The solution was subsequently filtered through a polyethylene microfilter having a pore size of 0.05 µm, thus obtaining a resist underlayer film-forming composition for lithography.

(Dissolution Test in Photoresist Solvent)

Each of the resist underlayer film-forming compositions for lithography prepared in Examples 1 to 3 and Comparative Example 1 was applied by a spinner onto a silicon wafer, which is a semiconductor substrate. The silicon wafer was placed on a hot plate, and baked at 205° C. for 1 minute to form a resist underlayer film having a film thickness of 20 to 22 nm. The resist underlayer film was immersed in a solvent composed of 70% by mass of propylene glycol monomethyl ether and 30% by mass of propylene glycol monomethyl ether acetate to determine whether the film was insoluble or not in the solvent. The results are shown in Table 1 below. The resist underlayer films formed using the resist underlayer film-forming compositions prepared in Examples 1 to 3 were confirmed to have sufficient solvent resistance, compared to the resist underlayer film formed using the resist underlayer film-forming composition prepared in Comparative Example 1.

TABLE 1

Solvent Resistance (Unit of Film Thickness: nm)

| | Initial Film Thickness | Film Thickness after Immersion | Film Thickness Reduction |
|---|---|---|---|
| Example 1 | 20 | 20 | 0 |
| Example 2 | 22 | 22 | 0 |
| Example 3 | 21 | 21 | 0 |
| Comparative Example 1 | 20 | 18 | 2 |

(Formation of Photoresist Patterns and Adhesion Test for Resist Patterns)

Each of the resist underlayer film-forming compositions for lithography prepared in Examples 1 to 3 and Comparative Example 2 was applied by a spinner onto a silicon wafer. The silicon wafer was placed on a hot plate and baked at 205° C. for 1 minute to form a resist underlayer film having a film thickness of 5 nm. A photoresist for the EUV lithography process was applied by a spinner onto this resist underlayer film, and heated on a hot plate at 110° C. for 60 seconds to form a photoresist film (film thickness 35 nm). Next, a line-and-space pattern (hereinafter abbreviated as L/S) was drawn on the photoresist film, using an electron beam-drawing apparatus (ELS-G130) from Elionix Inc. The drawn photoresist film was heated on a hot plate at 110° C. for 60 seconds, cooled, and then developed using a 0.26 N aqueous solution of tetramethylammonium hydroxide as a developer, in an industrial standard 60-second single paddle-type process. Through the above-described procedures, a resist pattern was formed on the silicon wafer. Table 2 shows the results of whether an L/S was formed or not, for the photoresist films on the resist underlayer films formed using the resist underlayer film-forming compositions for lithography of Examples 1 to 3 and Comparative Example 2. Cases where an intended L/S was formed were denoted as "Good".

Furthermore, the L/S drawing time using the above-described electron beam-drawing apparatus was increased stepwise from an optimal drawing time, which increased the irradiation time of the electron beam directed to the space portion of the L/S. As a result, the line width of the formed L/S was gradually reduced. At that time, the line width of the line pattern at one stage before collapse of the line pattern occurred was determined as a minimal pre-collapse dimension, which was used as an index of adhesion of the resist pattern. The results are shown in Table 2. A smaller value of the minimal pre-collapse dimension suggests higher adhesion between the resist underlayer film and the resist pattern. In particular, when the resist pattern has a fine line width, a difference of 1 nm is important. Thus, it is very preferable that the minimal pre-collapse dimension be smaller even by 1 nm.

| | Minimal Pre-Collapse Dimension (nm) | Whether an L/S was Formed or Not |
|---|---|---|
| Example 1 | 16 nm | Good |
| Example 2 | 15 nm | Good |
| Example 3 | 14 nm | Good |
| Comparative Example 2 | 20 nm | Good |

The invention claimed is:

1. A resist underlayer film-forming composition for lithography comprising:

a copolymer having a structural unit of formula (1) and a structural unit of formula (2):

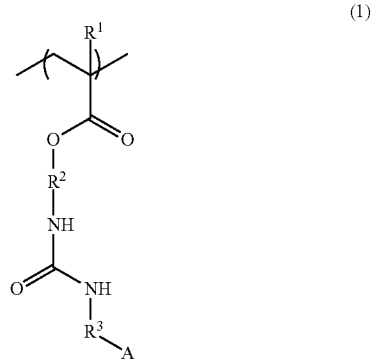

-continued (2)

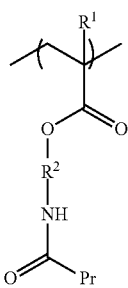

wherein each R is independently a hydrogen atom or a methyl group; each $R^2$ is independently a $C_{1-3}$ alkylene group; $R^3$ is a single bond or a methylene group; A is a linear, branched, or cyclic aliphatic group having a carbon atom number of 1 to 12 and optionally having a substituent, or a $C_{6-16}$ aromatic or heterocyclic group optionally having a substituent;

and Pr is a protecting group;
a crosslinking agent;
an organic acid catalyst; and
a solvent.

2. The resist underlayer film-forming composition for lithography according to claim 1, wherein the copolymer has, in addition to the structural unit of formula (1) and the structural unit of formula (2), a structural unit of formula (3):

(3)

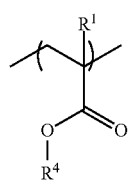

wherein $R^1$ is as defined in formula (1) above; and $R^4$ is a linear, branched, or cyclic aliphatic group having a carbon atom number of 1 to 12, in which at least one hydrogen atom is substituted with a fluoro group, the aliphatic group optionally further having at least one hydroxy group as a substituent.

3. The resist underlayer film-forming composition for lithography according to claim 1, wherein the structural unit of formula (1) is any of structural units of formulae (1a) to (1j):

(1a)

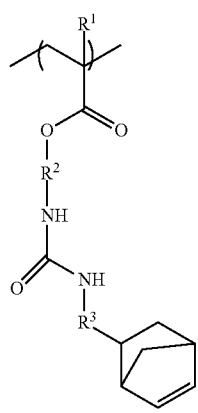

(1b)

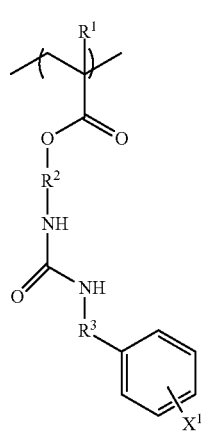

(1c)

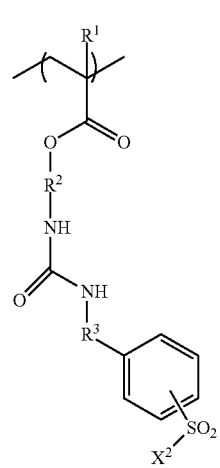

(1d)

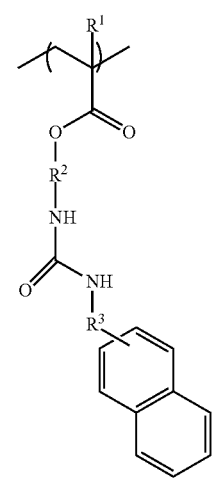

(1e) 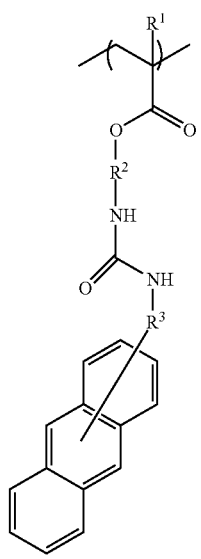

(1f) 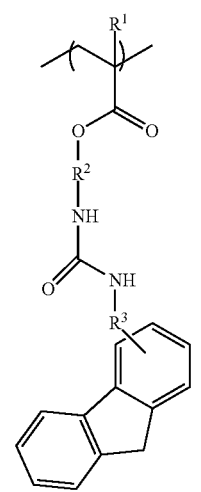

(1g) 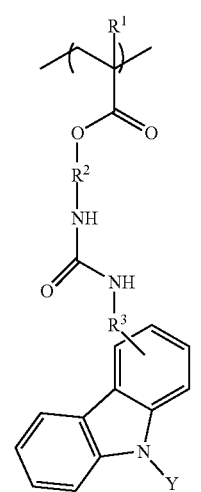

(1h) 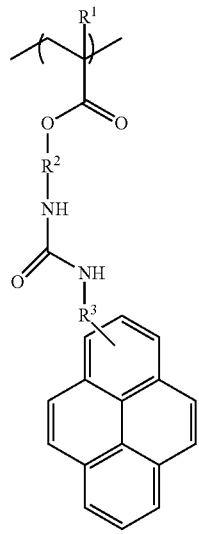

(1i) 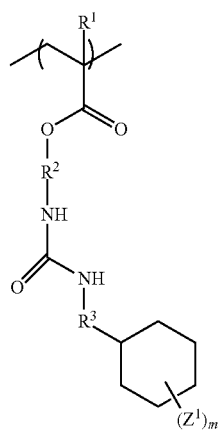

(1j) 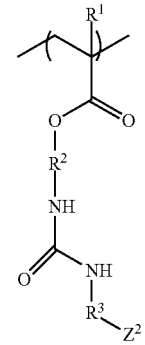

wherein $R^1$, $R^2$, and $R^3$ are as defined in formula (1) above; $X^1$ and $X^2$ are each independently a hydrogen atom, a hydroxy group, a halogeno group, or a methyl group in which at least one hydrogen atom is optionally substituted with a fluoro group; Y is a hydrogen atom, a methyl group, or an ethyl group; $Z^1$ and $Z^2$ are each independently a linear or branched alkyl group having a carbon atom number of 1 to 3, in which at least one hydrogen atom is optionally substituted with a fluoro group or a hydroxy group; and m is an integer from 0 to 2.

4. The resist underlayer film-forming composition for lithography according to claim 1, wherein the structural unit of formula (2) is a structural unit of formula (2a), a structural unit of formula (2b), a structural unit of formula (2c), or a structural unit of formula (2d):

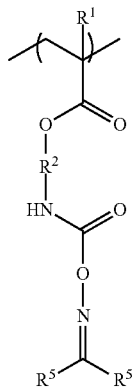

(2a)

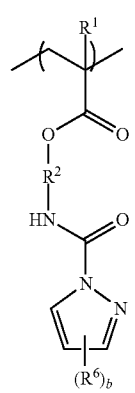

(2b)

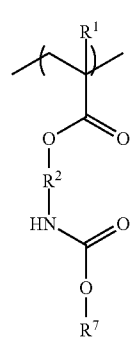

(2c)

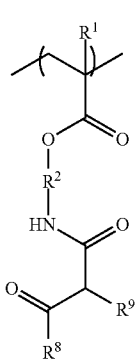

(2d)

wherein R and $R^2$ are as defined in formula (1) above; two $R^5$s are each independently a hydrogen atom, a methyl group, or an ethyl group; $R^6$ is a methyl group or an ethyl group; b is an integer from 0 to 3; $R^7$ is a linear or branched alkyl group having a carbon atom number of 1 to 6, or a linear or branched alkoxyalkyl group having a carbon atom number of 1 to 6; $R^8$ is a linear or branched alkoxy group having a carbon atom number of 1 to 6; and $R^9$ is a hydrogen atom, or a linear or branched alkoxycarbonyl group having a carbon atom number of 2 to 6.

5. The resist underlayer film-forming composition for lithography according to claim 1, wherein the copolymer has a weight average molecular weight of 1,500 to 20,000.

6. A method for forming a resist pattern comprising the steps of:

forming a resist underlayer film having a thickness of 1 to 25 nm by applying the resist underlayer film-forming composition for lithography according to claim 1 onto a substrate, and baking the composition;

forming a resist film by applying a resist solution onto the resist underlayer film, and heating the resist solution;

exposing the resist film to radiation selected from the group consisting of a KrF excimer laser, an ArF excimer laser, and extreme ultraviolet radiation through a photomask; and after the exposure, developing the resist film with a developer.

7. A monomer of formula (a), (b-3), (b-4), (b-5), (b-6), (b-7), (b-8), (c), (d), (e), (g), (i), (j-3), or (j-4):

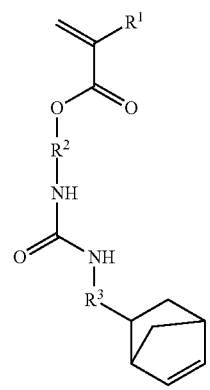

(a)

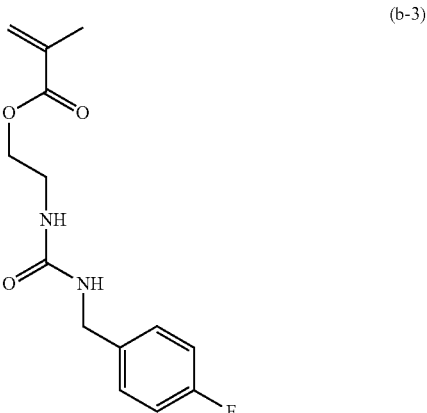 [SMILES: C=C(C)C(=O)OCCNC(=O)NCc1ccc(F)cc1]

(b-3)

(b-4)
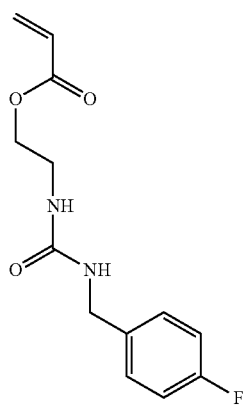
(b-5)
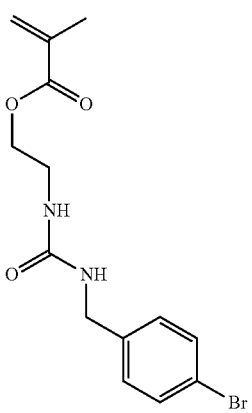
(b-6)
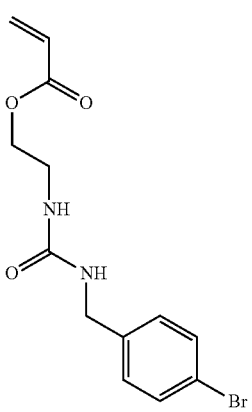
(b-7)
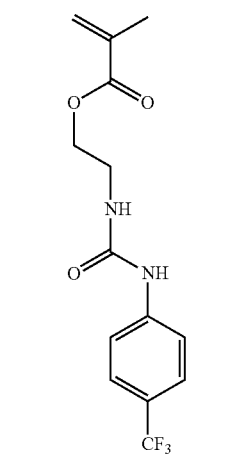
(b-8)
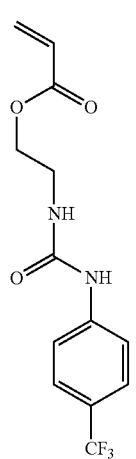
(c)
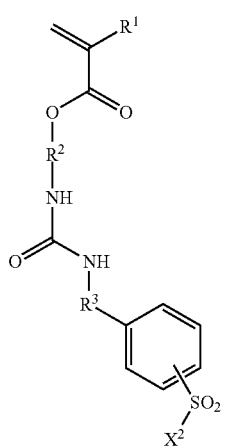
(d)
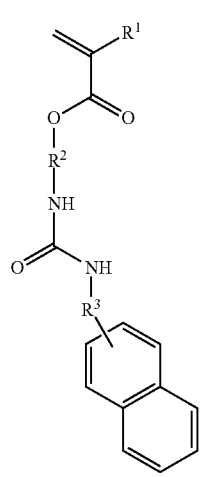

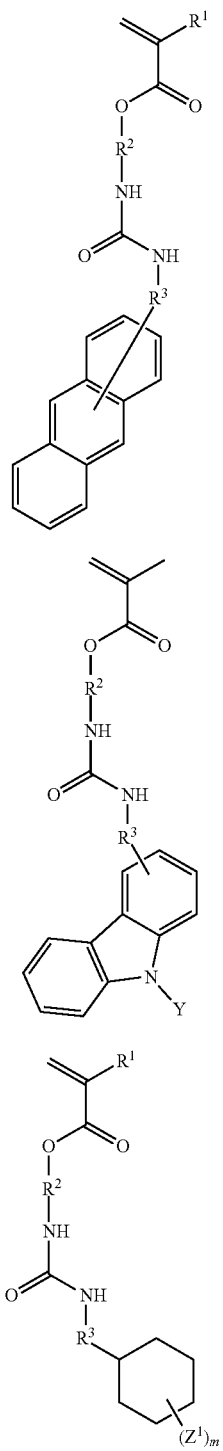

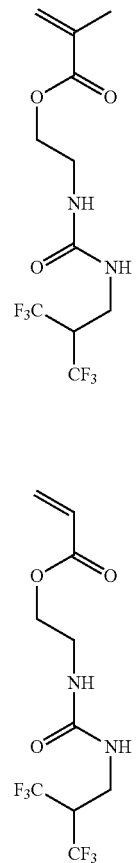

wherein:

each $R^1$ is independently a hydrogen atom or a methyl group;

each $R^2$ is independently a $C_1$-3 alkylene group;

$R^3$ is a single bond or a methylene group in each of formula (a), (c), and (i), and $R^3$ is a methylene group in each of formula (d), (e), and (g);

$X^2$ is a hydrogen atom, a halogeno group, or a methyl group in which at least one hydrogen atom is optionally substituted with a fluoro group;

Y is a hydrogen atom, a methyl group, or an ethyl group;

$Z^1$ is a linear or branched alkyl group having a carbon atom number of 1 to 3, in which at least one hydrogen atom is optionally substituted with a fluoro group or a hydroxy group; and m is an integer of 1 or 2.

* * * * *